United States Patent
Cox

[11] Patent Number: 6,166,439
[45] Date of Patent: Dec. 26, 2000

[54] LOW DIELECTRIC CONSTANT MATERIAL AND METHOD OF APPLICATION TO ISOLATE CONDUCTIVE LINES

[75] Inventor: William P. Cox, Santa Clara, Calif.

[73] Assignee: Advanced Micro Devices, Inc., Sunnyvale, Calif.

[21] Appl. No.: 09/000,739

[22] Filed: Dec. 30, 1997

[51] Int. Cl.[7] .......................... H01L 23/48; H01L 23/52; H01L 29/40

[52] U.S. Cl. .......................... 257/758; 257/759; 438/624

[58] Field of Search .................................. 257/758, 759, 257/760; 438/780, 624

[56] References Cited

U.S. PATENT DOCUMENTS

| | | | |
|---|---|---|---|
| 4,618,541 | 10/1986 | Forouhi et al. | 428/688 |
| 5,079,600 | 1/1992 | Schnur et al. | 427/54 |
| 5,116,459 | 5/1992 | Kordus et al. | 156/631 |
| 5,177,588 | 1/1993 | Ii et al. | 257/640 |
| 5,186,745 | 2/1993 | Maniar | 106/287 |
| 5,219,669 | 6/1993 | Chang et al. | 428/626 |
| 5,407,866 | 4/1995 | Sellers | 437/225 |
| 5,453,642 | 9/1995 | Kaja et al. | 257/766 |
| 5,549,786 | 8/1996 | Jones et al. | 156/662 |
| 5,578,226 | 11/1996 | Chan et al. | 216/33 |
| 5,594,080 | 1/1997 | Waymouth et al. | 526/126 |
| 5,641,712 | 6/1997 | Grivna | 438/624 |
| 5,665,657 | 9/1997 | Lee | 438/624 |
| 5,767,014 | 6/1998 | Hawker et al. | 438/623 |
| 5,783,481 | 7/1998 | Brennan et al. | 438/623 |
| 5,792,705 | 8/1998 | Wang et al. | 438/624 |
| 5,883,219 | 3/1999 | Carter et al. | 528/310 |
| 5,886,410 | 3/1999 | Chiang et al. | 257/759 |
| 5,889,330 | 3/1999 | Nishimuira et al. | 257/642 |
| 5,923,074 | 7/1999 | Jeng | 257/522 |
| 5,924,005 | 7/1999 | Waldo | 438/623 |

OTHER PUBLICATIONS

"Thin Hyperbranched Films Grafted to Gold, Silicon and Aluminum", by David E. Bergbreiter et al.; Department of Chemistry, Texas A&M University, pp. 943–944.

Abstract No. 928; "Hyperbranched Polymer films Containing Fluorescent, Hydropobic, Metal–ion Binding and Electroactive Functionalities ", by Merlin L. Bruening et al.; Department of Chemistry, Texas A&M University, pp. 1138.

*Primary Examiner*—Olik Chaudhuri
*Assistant Examiner*—Phat X. Cao
*Attorney, Agent, or Firm*—Amin, Eschweiler & Turocy, LLP

[57] ABSTRACT

A semiconductor device which includes a substrate and a conductive pattern formed on the substrate. The conductive pattern includes at least two conductive lines adjacent one another. A low dielectric constant (LDC) material is dispersed between the at least two conductive lines. The LDC material includes a polymeric material including a polymer having a first and second end. The first end includes a functional group adapted to substantially bond to an insulating layer covering at least a portion of the substrate. The second end includes a functional group adapted to substantially bond to a dielectric material deposited over the LDC material. The polymeric material also includes air pockets therein which facilitate mitigation of capacitive crosstalk between the at least two conductive lines.

13 Claims, 6 Drawing Sheets

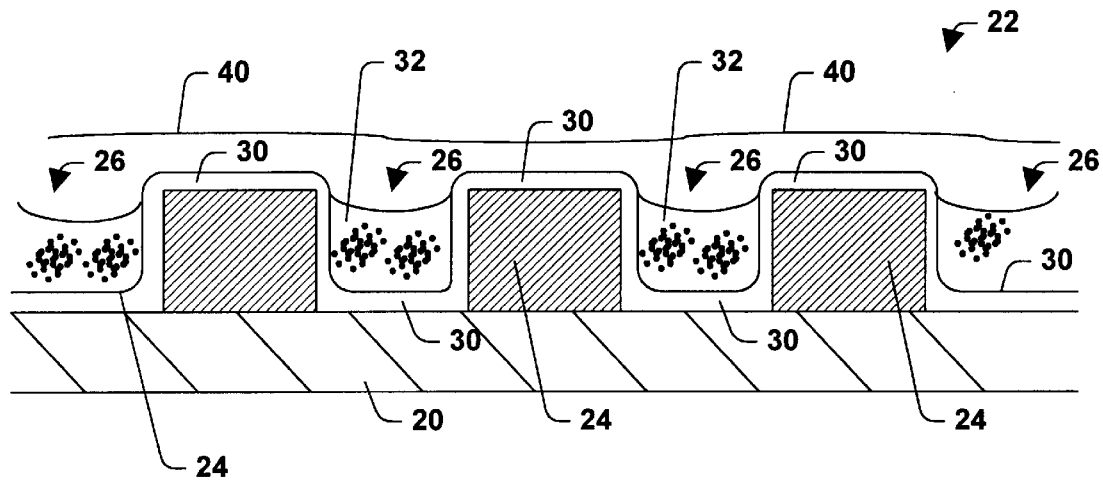
Prior Art Fig. 1
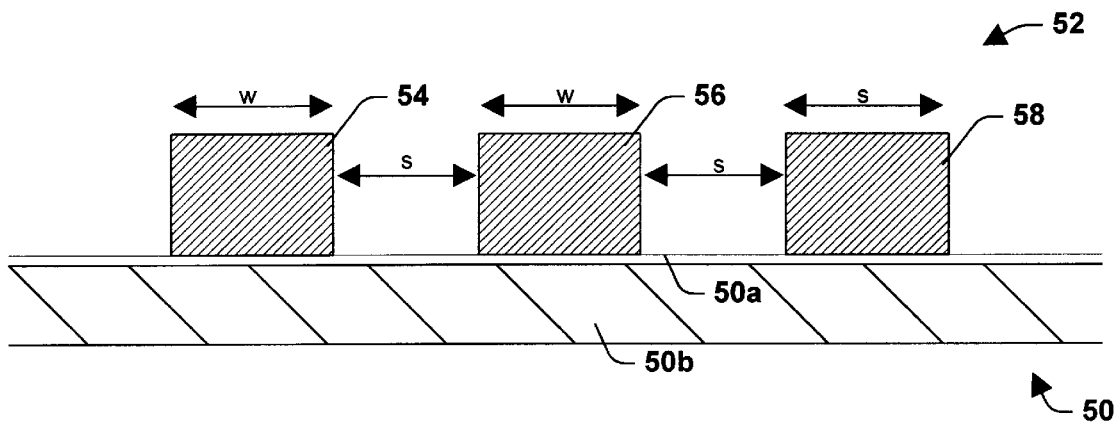
Fig. 2

LOW DIELECTRIC CONSTANT MATERIAL AND METHOD OF APPLICATION TO ISOLATE CONDUCTIVE LINES

TECHNICAL FIELD

The present invention generally relates to a low dielectric constant material and method which may be used to isolate metal lines of an integrated circuit such that delamination problems and/or cracking problems are mitigated.

BACKGROUND OF THE INVENTION

There is an increasing demand for miniaturization in the integrated circuits industry. This demand has led to an ever constant reduction in separation between conductive lines (e.g., metal lines) in order to reduce integrated circuit size and/or increase density. The reduced spacing between the conductive lines has the undesirable effect of increasing the capacitance of whatever material lies between the conductive lines. This phenomenon is known as capacitive crosstalk.

In the past, overall integrated circuit (IC) performance depended primarily on device properties, however, this is no longer the case. Parasitic resistance, capacitance and inductance associated with interconnections and contacts of an IC are beginning to become increasingly significant factors in IC performance. In current IC technology, the speed limiting factor is no longer device delay, but the resistive-capacitive (RC) delays associated with the conductive interconnections of the IC (e.g., metal lines).

Conventional ICs typically employ an interconnect structure wherein a first conductive line is adjacent a second conductive line. If the crosstalk or capacitance between the first conductive line and the second conductive line is high, then the voltage on the first conductive line alters or affects the voltage on the second conductive line. This alteration in voltage may result in the IC being inoperable as a result of misinterpreting logic zeros, logic ones and voltage levels, and consequently incorrectly processing binary and/or analog information In order to reduce capacitive coupling and therefore reduce capacitive crosstalk, low dielectric constant (low-K) materials have been developed to replace conventional dielectric/insulative materials that lie between conductive lines in order to insulate one conductive line from the other. Conventional insulative materials such as silicon dioxide exhibit a dielectric constant of about 4.0. Newer materials with lower dielectric constants have been developed. For example, polyimides generally exhibit a dielectric constant of about 2.4 to about 3.0; Teflon exhibits a dielectric constant of about 1.6 to 2.2; and aerogels typically exhibit a dielectric constant of about 2. However, the use of many low-K dielectric/insulative materials is not practicable because equipment is not available to properly process the new dielectric/insulative materials in various ICs. Furthermore, the chemical or physical properties of many low-K dielectric/insulative materials are usually difficult to make compatible or integrate into conventional IC processing.

FIG. 1 illustrates a portion of a conventional semiconductor fabrication process. An insulating layer is formed on a semiconductor substrate, both the insulating layer and substrate are generally indicated at 20. A conductive pattern 22 including conductive lines 24 is formed over the insulating/substrate layer 20. The conductive lines 24 are separated by interwiring spaces 26 formed on the insulating/substrate layer 20. A dielectric material such as silicon dioxide is deposited over the conductive lines 24 and the interwiring spaces 26 so as to form a dielectric liner 30. Subsequent to formation of the dielectric liner 30, spin on glass (SOG) 32 is deposited to fill the interwiring spaces and cured. After the SOG 32 is deposited, a capping layer 40 is deposited on the conductive pattern extending across the dielectric liner 30 and the interwiring spaces 26 which are filled with SOG. The capping layer 40 comprises a conventional dielectric material such as silicon dioxide.

Conventional semiconductors such as for example those fabricated according to the aforementioned method do not provide for sufficient insulation between the conductive lines 24 suitable for overcoming capacitive crosstalk in the case of closely separated conductive lines 24. Moreover, SOG materials have many drawbacks. When an SOG layer is formed to the thickness required of an interlevel dielectric, it exhibits an intolerable degree of cracking. In addition, adhesion failures are often observed at interfaces between SOG layers and metal interconnects. Delamination problems (i.e., adhesion failures at interfaces between SOG layers and overlying and underlying dielectric layers) have also been experienced.

In view of the above, there is a need in the art for a low dielectric constant material which may be employed to mitigate capacitive crosstalk between conductive lines of an integrated circuit, be less susceptible to cracking as compared to conventional materials and have good adhesion with an interface and/or conductive lines.

SUMMARY OF THE INVENTION

The present invention provides for a low dielectric constant (LDC) material which may be employed in an integrated circuit to mitigate capacative crosstalk between conductive lines of the IC. In particular, the LDC material of the present invention is a polymer which has first and second ends. The first end of the polymer includes properties which provide for good bonding with an insulating layer covering at least a portion of a substrate of the IC and the second end includes properties which provide for good bonding to an intermediate barrier layer or topside layer of the IC.

According to one specific aspect of the present invention, the LDC material is a hydrocarbon chain suspended in a suitable solvent medium which is dispersed using a spin-on method. The solubilized LDC material is dispersed to form a planarized layer that fills gap between adjacent conductive lines of the IC. The hydrocarbon chains of the LDC material have one end which has an affinity for the insulating layer covering at least a portion of the substrate of the IC and bonds therewith. The other end of the hydrocarbon chains has an affinity to bond with either of a subsequent dielectric layer or topside layer applied over the LDC material and conductive lines. The hydrocarbon chains are not cross-linked and thus provide for space (e.g., air) therebetween. Air has a substantially low dielectric constant ($\approx 1.0$) and the hydrocarbon chains are also of low dielectric constant thus providing for insulation between adjacent conductive lines of substantially low dielectric constant.

As a result, the present invention mitigates capacitive crosstalk between adjacent conductive lines of an IC. Furthermore, the bonding properties of the LDC material to the insulating layer and the upper dielectric or topside layer of the IC results in fewer delamination problems as compared to ICs using conventional materials. Moreover, since the polymers of the LDC material are not cross-linked, cracking problems associated with conventional materials (e.g., SOG) are mitigated.

In accordance with one specific aspect of the present invention, a semiconductor device is provided. The semiconductor device includes a substrate and a conductive pattern formed on an insulating layer covering at least a portion of the substrate. The conductive pattern includes at least two conductive lines adjacent one another. A low dielectric constant (LDC) material is dispersed between the at least two conductive lines. The LDC material includes a polymeric material comprising a polymer having a first and second end; wherein the first end includes a functional group adapted to substantially bond to the insulating layer.

Another aspect of the present invention provides for a semiconductor device which includes a substrate and a conductive pattern formed on an insulating layer covering at least a portion of the substrate. The conductive pattern includes at least two conductive lines adjacent one another. A dielectric liner is deposited over the insulating layer and conductive pattern. A low dielectric constant (LDC) material is dispersed between the at least two conductive lines. The LDC material includes a polymeric material comprising a polymer having a first and second end; wherein the first end includes a functional group adapted to substantially bond to the dielectric liner.

In accordance with still another aspect of the present invention, a semiconductor device is provided which includes a substrate and a conductive pattern formed on an insulating layer covering at least a portion of the substrate, the conductive pattern including at least two conductive lines adjacent one another. An adhesion promoter layer is deposited over the insulating layer between the at least two conductive lines; and a low dielectric constant (LDC) material dispersed is between the at least two conductive lines and over the adhesion promoter layer. The LDC material includes a polymeric material comprising a polymer having a first and second end; wherein the first end includes a functional group adapted to substantially bond to the adhesion promoter layer.

In accordance with yet another aspect of the present invention a semiconductor device is provided which includes a substrate and a conductive pattern formed on an insulating layer covering at least a portion of the substrate, the conductive pattern including at least two conductive lines adjacent one another. A dielectric liner is deposited over the insulating layer and the conductive pattern. An adhesion promoter layer is deposited over the dielectric liner; and a low dielectric constant (LDC) material is dispersed between the at least two conductive lines and over the dielectric liner. The LDC material includes a polymeric material comprising a polymer having a first and second end; wherein the first end includes a functional group adapted to substantially bond to the dielectric liner.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 1 is a schematic cross-sectional illustration of a portion of a semiconductor device fabricated in accordance with conventional techniques;

FIG. 2 is a schematic cross-sectional illustration of a portion of a semiconductor device including a conductive pattern in accordance with the present invention;

DETAILED DESCRIPTION OF THE INVENTION

Figure 3:
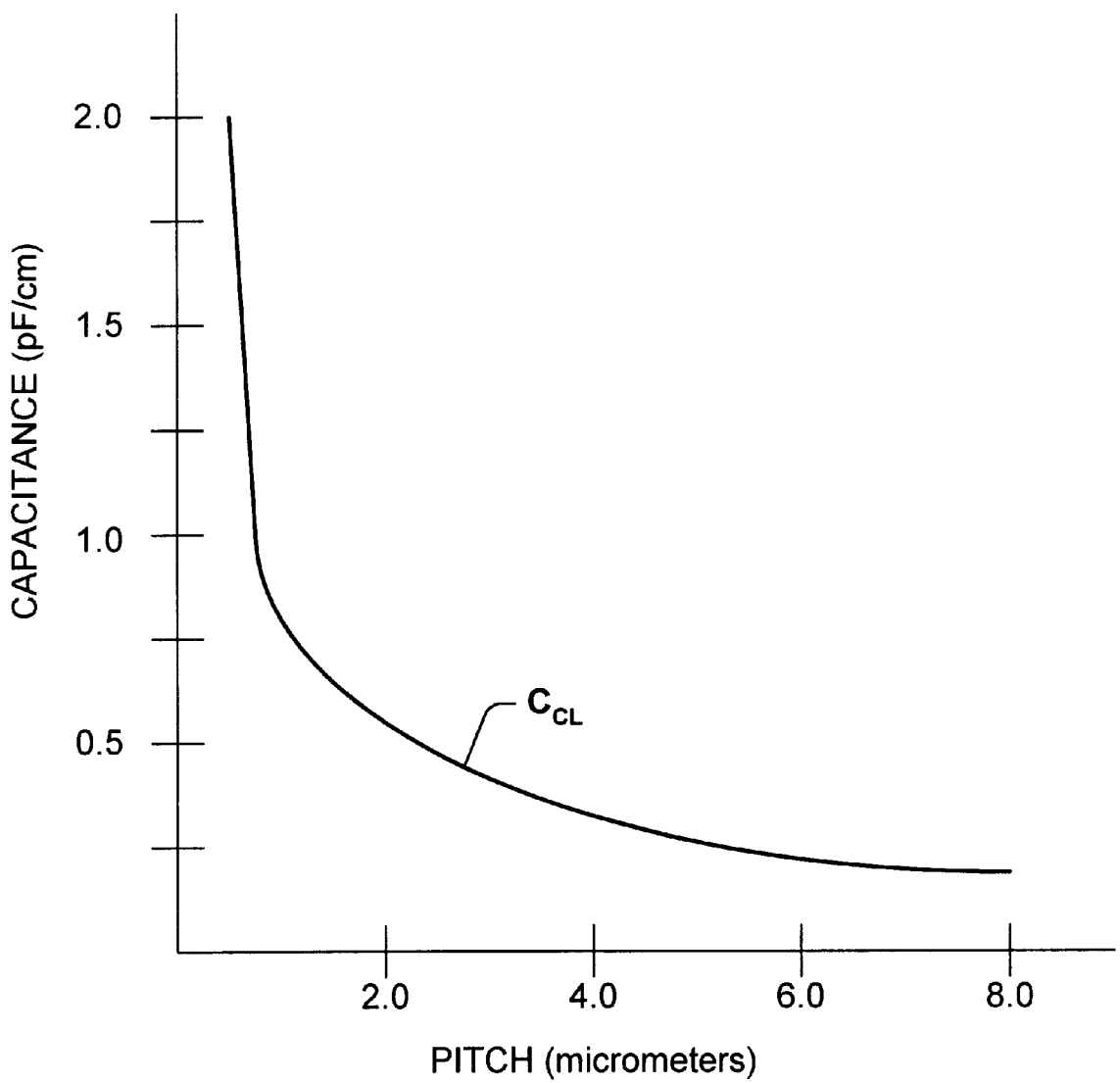
FIG. 3 is a graphical illustration of a relationship between conductive line pitch and capacitive coupling in accordance with the present invention.

The present invention will now be described with reference to the drawings, wherein like reference numerals are used to refer to like elements throughout. The method of the present invention will be described with reference to the formation of a semiconductor device having a low dielectric constant material applied between conductive lines which may serve to bond with a substrate and upper or topside layer of the IC so as to facilitate reduction of capacitive crosstalk between the conductive lines, and mitigate delamination and cracking problems.

The following detailed description is of the best modes presently contemplated by the inventor for practicing the invention. It should be understood that the description of these preferred embodiments are merely illustrative and that they should not be taken in a limiting sense.

Referring initially to FIG. 2, an insulating layer 50a is formed on a substrate 50b via a suitable deposition technique such as for example using chemical vapor deposition (CVD) or by a spinning technique. A conductive pattern 52 (e.g., including conductive lines 54, 56 and 58) is formed over the insulating layer 50a. Preferably the conductive pattern 52 is formed by depositing a metalization layer and patterning employing suitable photolithographic and etching techniques (e.g., anisotropic etching such as reactive ion etching). The conductive pattern may be deposited by any of a variety of suitable deposition techniques, such as CVD processes including low pressure chemical vapor deposition (LPCVD) and plasma enhanced chemical vapor deposition (PECVD), melting or sputtering.

According to one specific aspect of the present invention, the conductive pattern 52 is formed in the following manner.

The substrate/insulating layer 50 serves as the base upon which the conductive pattern 52 is constructed. The conductive pattern 52 typically rests on the insulating layer 50a which may comprise a ceramic material such as a glass-ceramic, alumina, phosphorus-doped silicon dioxide, undoped silicon dioxide or an insulating dielectric polymer such as a cured epoxy resin or a cured polyimide resin.

Next, a thin layer of conductive metal is applied to the clean surface of the insulating layer 50a by any suitable process such as sputtering or vapor deposition to yield a conductive film layer having a preferred thickness in the range of about 0.3 to about 25 microns adhered to the insulating layer 50a. Conductive metals which may be applied include copper, aluminum, silver, alloys thereof or successive layers of copper and chrome as is known in the art. The preferred conductive metal is presently aluminum or an aluminum alloy however any suitable material may be employed.

In the next layer, a layer of suitable positive or negative photoresist material is applied to the clean surface of the conductive metal layer and dried. The resist layer may be any suitable standard resist material and may be positive acting or negative acting. The resists may be sensitive to near, mid, and deep UV, electron beam, x-ray, ion beam or laser radiation. The resist layer may be applied by any suitable process such as, for example, spin coating from solution, followed by drying. The thickness of the dried resist may range from about 0.6 to about 150 microns.

A circuit image of any desired pattern is next formed within the resist layer by exposure if the resist layer to radiation through an appropriate photographic mask or by controlled laser, ion beam or electron beam energy sources, followed by suitable development to remove the exposed or unexposed areas of the resist, depending on resist chemistry. The development step exposes that portion of the conductive metal layer surface to be etched away, while the remaining portions of the surface continue to be masked by the resist. Positive resist materials are preferred for this invention since they may be developed using aqueous alkaline developer materials such as alkali or alkaline earth metal hydroxide or metal-silicate aqueous solutions.

Next the resist-masked structure is contacted with a chemical etchant such as an acidic solution, which is effective to remove the exposed conductive metal down to the surface of the substrate/insulation layer while leaving the masked metal layers substantially intact. The remaining resist is then removed by dissolution using suitable aqueous or solvent based solutions.

The resulting etched structure comprises a conductive pattern 52 of conductive metal lines adhered to the insulating layer 50a. The average density of the conductive metal lines may range from about 200 to about 10,000 lines per linear inch.

It is to be appreciated that the conductive pattern 52 formed in the claimed invention may comprise any suitable conductive material employable for forming conductive patterns in the semiconductor industry. Preferably, the conductive material includes a member selected from the group consisting of refractory materials, such as titanium and titanium alloys, tungsten and tungsten alloys, aluminum and aluminum alloys, copper and copper alloys and polycrystalline silicon. The insulating material 50 employed in the present invention may comprise any suitable insulating material employable in the semiconductor industry for forming insulating layers. Preferably, the insulating material comprises a member selected from the group consisting of nitrides, oxides, oxy-nitrides, polyimides and polymeric materials.

The conductive lines 54, 56 and 58 making up the conductive pattern 52 in the exemplary embodiment are adjacent each other and provide necessary electrical connections between devices of an integrated circuit (not shown). Although only three conductive lines 54, 56 and 58 are shown for ease of understanding, it is to be appreciated that many thousands or even millions more such conductive lines may exist in the integrated circuit. As noted above, the increasing demand for miniaturization in the integrated circuits industry has lead to an ever constant reduction in separation between the conductive lines 54, 56 and 58 in order to reduce integrated circuit size. However, the reduced spacing between the conductive lines 54, 56 and 58 has the undesirable effect of increasing the capacitance of whatever material lies between the conductive lines 54, 56 and 58 to result in capacitive crosstalk between adjacent conductive lines.

A quantity known as pitch (pitch=w+s) is often employed to characterize conductive capacitance crosstalk for adjacent conductive lines used in the integrated circuit industry, where "w" is the cross-sectional width of a conductive line and "s" is the distance of separation between adjacent conductive lines. FIG. 3 graphically illustrates the capacitance between the conductive lines 54, 56 and 58 as a function of physical separation. A reduction in pitch is an ongoing activity in the integrated circuit industry in order to optimize substrate surface area utilization in integrated circuits. The capacitance between the conductive lines 54, 56 and 58 labeled $C_{CL}$ in FIG. 3 is shown to increase exponentially as pitch is reduced or as the conductive lines 54, 56 and 58 are brought closer together. The increase in capacitive coupling resulting from the conductive lines 54, 56 and 58 being brought closer together contributes to capacitive crosstalk between the adjacent conductive lines 54, 56 and 58, respectively.

Since market forces are driving the integrated circuitry towards bringing the conductive lines 54, 56 and 58 closer together in order to maximize substrate surface utilization, insulation having low dielectric constant is required between the conductive lines 54, 56 and 58 in order isolate the conductive lines 54, 56 and 58 from one another and to lower capacitive coupling between the conductive lines 54, 56 and 58, respectively, and in turn reduce capacitive crosstalk. Conventional materials having dielectric constants of about K=4.3 do not adequately reduce capacitive coupling resulting from the closer proximity of the adjacent conductive lines 54, 56 and 58. Although newer dielectric materials having lower dielectric constants of about K=1.9 (e.g., Teflon) are known, such materials are difficult to process in integrated circuit fabrication.

Turning now to FIGS. 4a–4d, the present invention employs a low dielectric constant (LDC) material 59 which preferably includes polymers that are not crosslinked. In particular, the LDC material 59 of the present invention is a polymer which has first and second ends. The first end of the polymer includes properties which provide for good bonding with the insulating layer 50a (FIG. 4b) or dielectric liner 60 (FIG. 4a) or adhesion layer 61 (FIGS. 4c and 4d) of the IC 80 and the second end includes properties which provide for good bonding to an intermediate barrier layer or topside layer 90 (FIGS. 4e, 4f, 4g and 4h) of the IC 80.

Figure 4A:
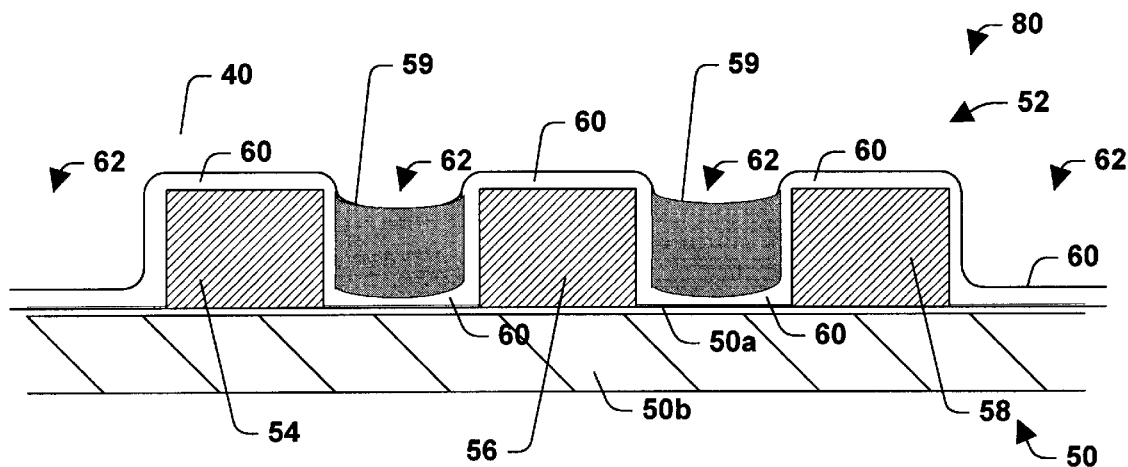
FIG. 4a is a schematic cross-sectional illustration of a semiconductor device including a dielectric liner fabricated in accordance with the present invention.
Figure 4B:
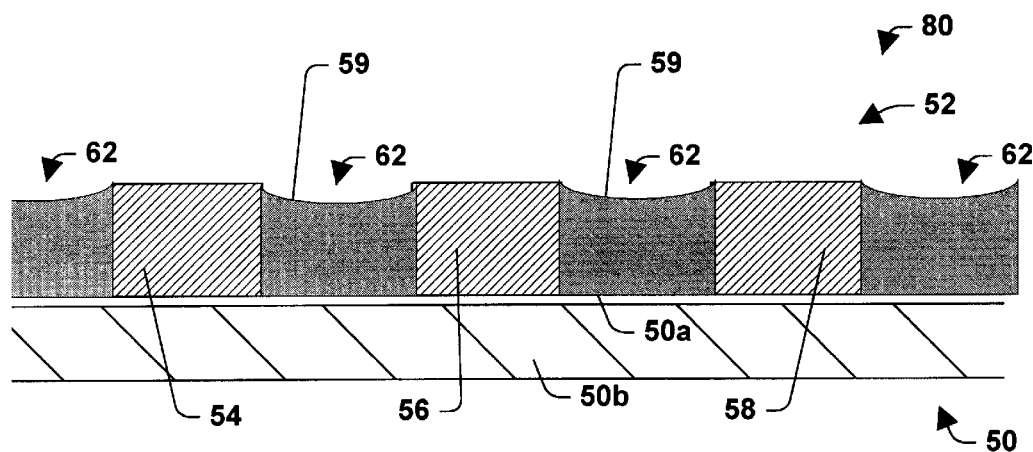
FIG. 4b is a schematic cross-sectional illustration of a semiconductor device without a dielectric liner fabricated in accordance with the present invention.
Figure 4C:
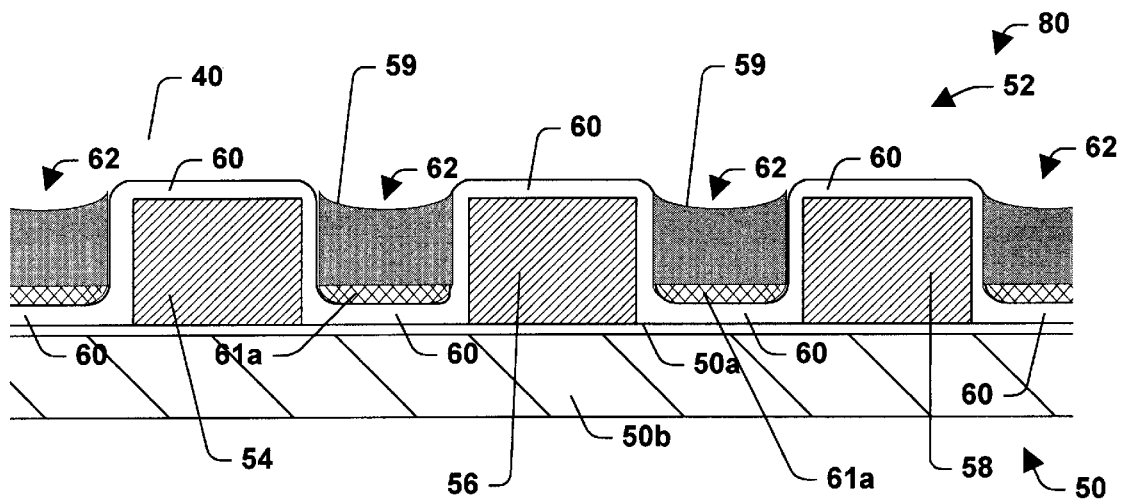
FIG. 4c is a schematic cross-sectional illustration of a semiconductor device including an adhesion layer and dielectric liner fabricated in accordance with the present invention.
Figure 4D:
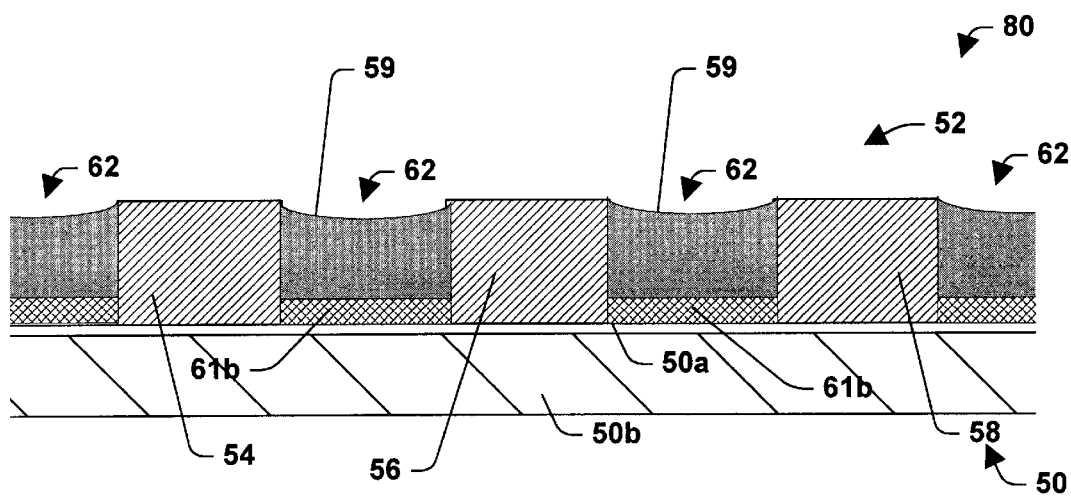
FIG. 4d is a schematic cross-sectional illustration of a semiconductor device including an adhesion layer and without a dielectric liner fabricated in accordance with the present invention.
Figure 4E:
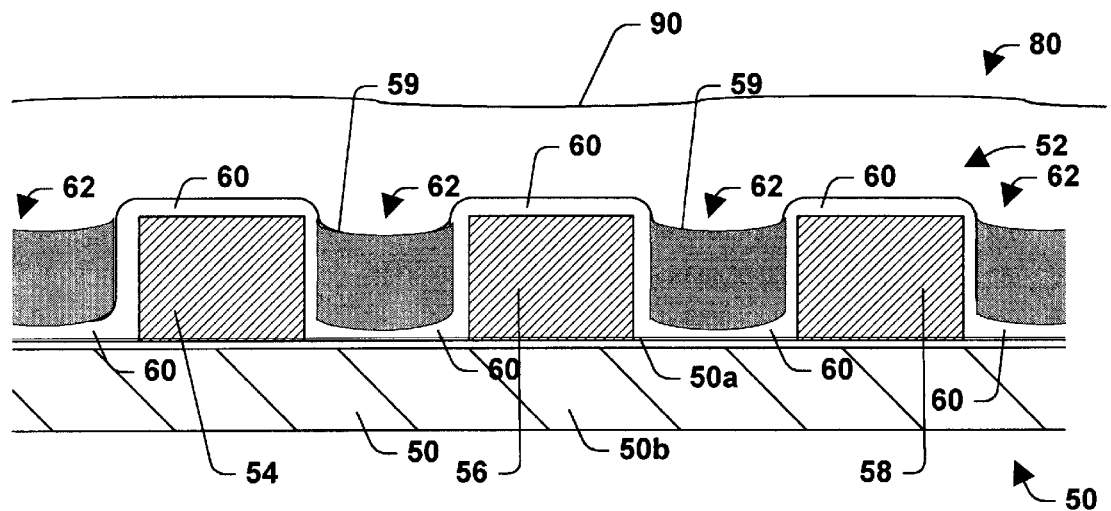
FIG. 4e is a schematic cross-sectional illustration of the semiconductor device of FIG. 4a including a capping layer in accordance with the present invention.
Figure 4F:
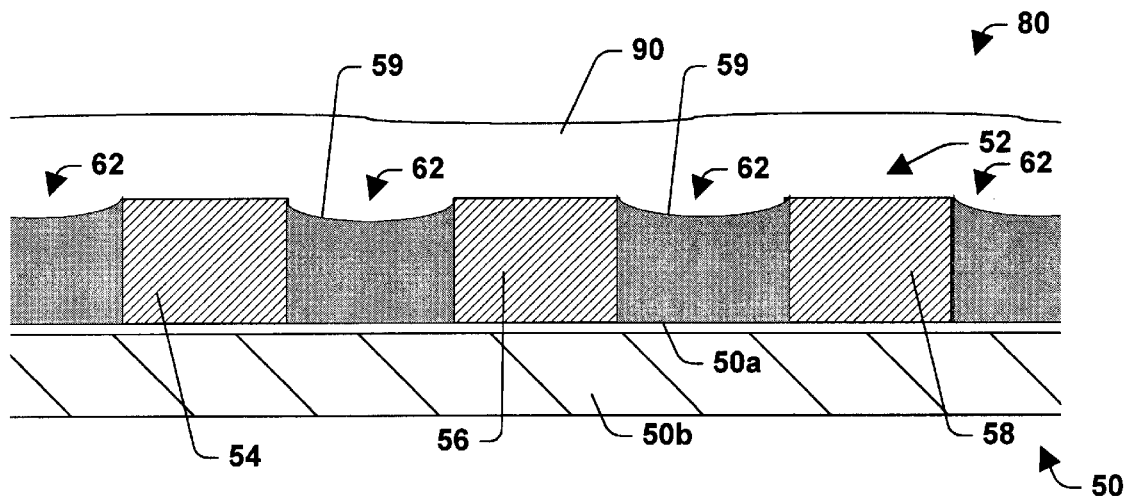
FIG. 4f is a schematic cross-sectional illustration of the semiconductor device of FIG. 4b including a capping layer in accordance with the present invention.
Figure 4G:
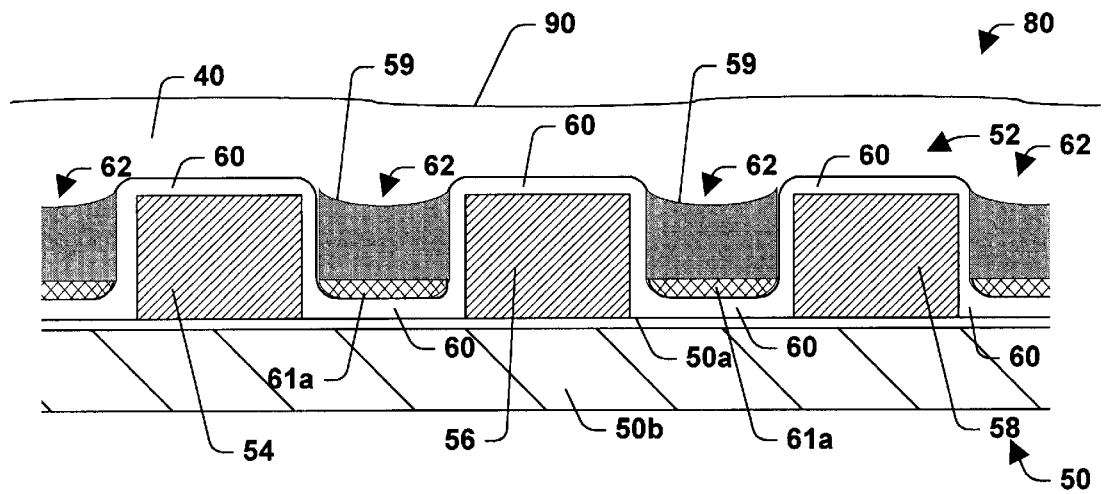
FIG. 4g is a schematic cross-sectional illustration of the semiconductor device of FIG. 4c including a capping layer in accordance with the present invention.
Figure 4H:
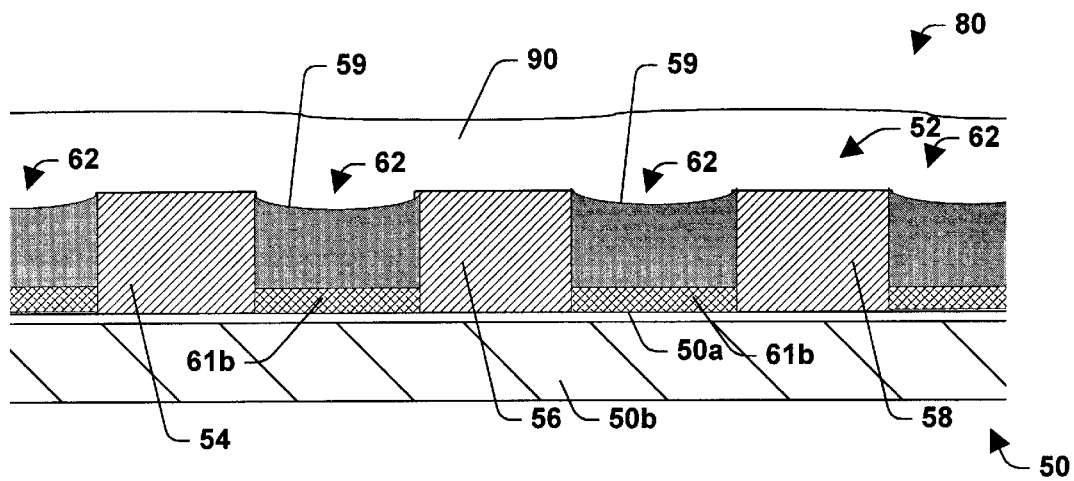
FIG. 4h is a schematic cross-sectional illustration of the semiconductor device of FIG. 4d including a capping layer in accordance with the present invention.

According to one specific aspect of the present invention, the LDC material 59 is a high molecular weight hydrocarbon chain suspended in a suitable solvent medium which is dispersed using a spin-on method. The solubilized LDC material 59 is dispersed to form a planarized layer that fills gaps 62 between adjacent conductive lines 54, 56 and 58 of the IC 80. In one specific embodiment as shown in FIG. 4b, the hydrocarbon chains of the LDC material have one end which has an attraction to the insulating layer 50a of the IC 80 and bonds therewith. The other end of the hydrocarbon chains has an affinity to bond with either of a subsequent dielectric layer or topside (capping) layer 90 applied over the LDC material 59 and conductive lines 52. The hydrocarbon chains are not cross-linked and thus provide for space (e.g., air) therebetween. Air has a substantially low dielectric constant ($\approx 1.0$) and the hydrocarbon chains are also of low dielectric constant thus providing for insulation between adjacent conductive lines of substantially low dielectric constant.

As a result, the present invention mitigates capacitive crosstalk between the adjacent conductive lines 52 of the IC 80. Furthermore, the bonding properties of the LDC material 59 to the insulating layer 50a and the upper dielectric or topside layer 90 of the IC 80 results in fewer delamination problems as compared to ICs using conventional materials. Moreover, since the polymers of the LDC material are not cross-linked, cracking problems associated with conventional materials (e.g., SOG) are mitigated.

Prior to depositing the LDC material, an adhesion promoter layer 61 (FIGS. 4c and 4d) may optionally be deposited. The adhesion promoter layer 61 promotes adhesion between the insulating layer 50a (FIG. 4d) or dielectric layer 60 (between the conductive lines (FIG. 4c)) to which the LDC material 59 bonds. In one embodiment, the adhesion promoter layer 61 is a silane coupling agent. Examples of silane coupling agents include aminopropyltriethoxysilane, glycidoxypropyltrimethoxysilane, methacryloxypropyltrimethoxysilane, vinyltrichlorosilane, vinyltriethoxysilane and aminopropyltrimethoxysilane.

In another embodiment, the adhesion promoter layer 61 contains a dendrimer polymer having functional end groups. Functional end groups include $-SiCl_3$, $-NH_2$, $-Si(OH)_3$ and $-CO_2H$. The functional end groups of the dendrimer polymer bond to the insulating layer 50a or the dielectric layer 60 while providing functional groups to which the LDC material 59 can bond. The dendrimer polymer may be a star polymer having numerous branched hydrocarbon segments, such as polyalkyl or poly(alkyleneoxide) segments.

In another embodiment, the adhesion promoter layer 61 is a reactive surface constituted by a monolayer containing functional groups such as $-CO_2H$ or $-NH_2$. For example, a typical procedure involves treatment with ethanolic solutions of mercaptoundecanoic acid. Alternatively, successive treatments with aminopropyltriethoxysilane and an organic anhydride such as succinic acid can be used to make a $-CO_2H$ functional group containing adhesion promoting layer.

In another embodiment, the adhesion promoter layer 61 is a $-CO_2H$ functional group containing layer further modified by the addition of a fluorinated polymer and/or polyacrylic acid. For example, activating the $-CO_2H$ functional group containing layer with $ClCO_2CH_2CH_3$ or carbonyl diimidazole and reaction with a diamino-poly-t-butylacrylate polymer followed by hydrolysis to yield a grafted layer of polyacrylic acid having a high degree of branching. In another embodiment, this same procedure can be used except that a large excess of a fluorinated compound such as $NH_2CH_2(CF_2)_6CF_3$, is added with the diamino-poly-t-butyl-acrylate polymer.

The LCD material 59 is next deposited on the insulating layer 50a or dielectric film 60 or the optional adhesion promoter layer 61 between the conductive lines 52. In one embodiment, the LCD material 59 is contained in a suitable solvent which is dispersed, for example, by using a spin-on method. Suitable solvents include any organic solvent which does not deleteriously affect the conductive lines 52, optional adhesion promoter layer 61 if present, the insulating layer 50a or dielectric film 60. The LCD material 59 is a polymer having a first end and a second end. The first end is capable of bonding to the optional adhesion promoter layer 61 if present, the substrate 50 or the dielectric film 60. The second end of the polymer is capable of bonding to an intermediate barrier layer or topside layer 90 of the IC 80. The LCD material 59 may therefore contain functional groups at the first and second ends. Examples of functional groups include $-NH_2$, $-RNH$, $-R_2N$, $-SiCl_3$, $-Si(OH)_3$, $-CO_2H$, $-OH$ and the like. Between the first and second ends, the LCD material 59 contains a hydrocarbon chain. The hydrocarbon chain is substantially hydrocarbon in nature, but may contain various heteroatoms such as oxygen, nitrogen and sulfur which do not substantially detract from the hydrocarbon nature of the hydrocarbon chain. In a preferred embodiment, the LDC material 59 is an elastomeric polyolefin.

In one embodiment, the hydrocarbon chain of the LCD material is a fluorinated poly(arylenether). In another embodiment, the hydrocarbon chain of the LCD material is a polyimide. In another embodiment, the LCD material 59 is a polyolefin. Polyolefins include homopolymers and copolymers of ethylene, propylene, butylene, isobutylene, etc. Examples of polyolefins are disclosed in U.S. Pat. Nos. 5,594,080; 5,385,877; 5,118,768; 4,542,199; 4,335,225; and 4,294,722, which are hereby incorporated by reference. In another embodiment, the hydrocarbon chain of the LCD material is a poly(alkyleneoxide) such as polyethylene oxide, polypropylene oxide and the like.

Thus, FIGS. 4a–4d are schematic cross-sectional illustrations of semiconductor devices fabricated in accordance with the present invention wherein the low dielectric constant (LDC) material 59 has been dispersed between the conductive lines 54, 56 and 58. As noted above, the LDC material includes polymers that are bonded between the insulating layer 50a and dielectric material 90. Since the polymers are not cross-linked air pockets are encapsulated between the polymers in the gaps between the conductive lines 54, 56 and 58. The air pockets and LDC material 59 provide for an insulative medium between adjacent conductive lines having low dielectric constant. The dielectric constant of air is substantially low (e.g., $K\approx 1$) and the dielectric constant of the LDC material 59 is also substantially low (e.g., preferably <2.0) which affords for facilitating the reduction of capacitive crosstalk between the adjacent conductive lines 54, 56 and 58, respectively.

Turning now to FIGS. 4e–4h, the deposition of dielectric material 90 over the ICs 80 of FIGS. 4a–4d is shown, respectively. Preferably, silicon nitride is employed as the dielectric material 90 deposited in this step. The dielectric material 90 is deposited to form a topside layer. Preferably, the topside layer dielectric material 90 is silicon nitride deposited via PECVD, however, it should be appreciated that any suitable dielectric material and deposition technique may be employed and falls within the scope of the claims. For example, suitable techniques for depositing the dielectric material 90 may include high density plasma chemical vapor deposition (HDPCVD) techniques such as electron cyclotron resonance (ECR), inductor coupled plasma (ICP), transformer coupled plasma (TCP) and helicon plasma. The thickness of the topside layer 90 is selected for optimum reduced capacitance and is preferably less than about 2 microns thick. If desired, the deposited dielectric material (e.g., topside layer) 90 may then be planarized in a suitable manner, as by etching or chemical-mechanical polishing (CMP). It is to be appreciated that the dielectric material 90 is preferably chosen such that the LDC material 59 bonds well with it. As will be described below, the employment of the LDC material 59 of the present invention affords for a semiconductor device having a topside layer 90 that is substantially transparent to UV light and which is less susceptible to delamination problems as compared to many conventional semiconductor devices.

One problem in most semiconductor integrated circuits is contamination by undesirable ionic species. The ions of certain contaminants such as sodium are mobile in silicon dioxide (a commonly used dielectric material) and drift through the silicon dioxide toward regions with a negative bias. These contaminants may interfere with the normal operation of the semiconductor device by giving rise to changes in device characteristics, possibly leading to failure of the integrated circuit. This is one reason that integrated circuit devices employ a topside (i.e., passivation layer) if they are to be encapsulated in standard low-cost, plastic packaging in order to protect the underlying structure from both moisture and contaminants.

In the early development of memory-type integrated circuits, a need became apparent for reprogrammable cells to accommodate project and program development during which specifications and performance criteria often change. This need has largely been supplied by the ultraviolet (UV) radiation erasable programmable read only memory (EPROM) integrated circuit. Basically, the erase feature is activated and accomplished by radiating ultraviolet light onto the semiconductor chip. The impinging radiation excites the electrons trapped on a floating gate region of the circuit structure and causes the electrons to move off the floating gate. In order to perform the erase function, the topside layer 90 of the integrated circuit must be transparent to UV light to a degree sufficient to allow the energy levels of the trapped electrons to be raised to a state where they will diffuse off the gate.

Silicon nitride (principally $Si_3N_4$) is an exemplary composition for use as the topside layer 90 on semiconductor integrated circuits. It has a high resistance to moisture and hydrogen penetration which would ruin an integrated circuit. Moreover, diffusivity of various impurities such as sodium is much lower in silicon nitride than in other insulators such as silicon dioxide. Thus, an integrated circuit made with a silicon nitride topside layer 90 is less susceptible to ionic contamination problems and moisture penetration problems as compared to those employing silicon dioxide for example.

Regardless of the deposition system employed, to be transparent to UV radiation, a silane-to-ammonia ratio must be carefully adjusted and the temperature raised sufficiently to achieve minimal excess silicon level (i.e., the silicon in excess of the level which exists in stoichiometrically pure silicon nitride is minimized). In one specific example, a commercially available AMS3300 system achieves the desired result by operating at 350 degrees Centigrade with a flow ratio of 70 SCCM silane to 210 SCCM ammonia in the presence of a nitrogen carrier gas having a 960 SCCM flow level. Maintaining a 0.3 Torr pressure in the chamber with 450 Watt/50 KHz RF irradiation yields a silicon nitride layer with a refractive index of 1.93±0.03. Thus, the silicon nitride topside layer 90 will be essentially transparent to UV light if it contains minimal excess silicon over a stoichiometric silicon nitride level. An exemplary method of forming a silicon nitride film transparent to ultraviolet radiation is described in U.S. Pat. No. 4,618,541, is assigned to Advanced Micro Devices, Inc. in Sunnyvale, Calif. and is hereby incorporated by reference.

Thus, the present invention provides for a low dielectric constant material 59 and method thereof which may be employed as an insulator between conductive lines 52 of an integrated circuit 80 to mitigate capacative crosstalk between the conductive lines 52. Since the LDC material 59 comprises a polymeric material that is not crosslinked, air pockets may be encapsulated therein. As a result, the overall dielectric constant of the material (e.g., air pockets and polymeric material) between the conductive lines 52 is substantially low. Furthermore, because polymer strings of the polymeric material are not cross-linked, the LDC material 59 is less susceptible to cracking as compared to conventional insulative materials such as SOG. The bonding aspects of the polymeric material affords for mitigating delamination problems as well.

What has been described above are preferred embodiments of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A semiconductor device comprising:

a substrate;

a conductive pattern formed on an insulating layer covering at least a portion of the substrate, the conductive pattern including at least two conductive lines adjacent one another;

an adhesion promoter layer deposited over the insulating layer between the at least two conductive lines; and a low dielectric constant (LDC) material dispersed between the at least two conductive lines and over the adhesion promoter layer, the LDC material including:

a polymeric material comprising a polymer having a first and second end; wherein the first end includes a functional group adapted to substantially bond to the adhesion promoter layer, the adhesion promoter layer is a silane coupling agent comprising at least one of: aminopropyltriethoxysilane, glycidoxypropyltrimethoxysilane, methacryloxypropyltrimethoxysilane, vinyltrichlorosilane, vinyltriethoxysilane and aminopropyltrimethoxysilane.

2. A semiconductor device comprising:

a substrate;

a conductive pattern formed on an insulating layer covering at least a portion of the substrate, the conductive pattern including at least two conductive lines adjacent one another;

an adhesion promoter layer deposited over the insulating layer between the at least two conductive lines; and a low dielectric constant (LDC) material dispersed between the at least two conductive lines and over the adhesion promoter layer, the LDC material including:

a polymeric material comprising a polymer having a first and second end; wherein the first end includes a functional group adapted to substantially bond to the adhesion promoter layer, the adhesion promoter layer containing a dendrimer having functional end groups, the functional end groups comprising at least one of: —SiCl$_3$, —NH$_2$, —Si(OH)$_3$ and —CO$_2$H.

3. A semiconductor device comprising:

a substrate;

a conductive pattern formed on an insulating layer covering at least a portion of the substrate, the conductive pattern including at least two conductive lines adjacent one another;

an adhesion promoter layer deposited over the insulating layer between the at least two conductive lines; and a low dielectric constant (LDC) material dispersed between the at least two conductive lines and over the adhesion promoter layer, the LDC material including:
  a polymeric material comprising a polymer having a first and second end; wherein the first end includes a functional group adapted to substantially bond to the adhesion promoter layer, the adhesion promoter layer comprising a reactive surface constituted by a monolayer containing functional groups, the functional groups including at least one of: —CO$_2$H and —NH$_2$.

4. A semiconductor device comprising:

a substrate;

a conductive pattern formed on an insulating layer covering at least a portion of the substrate, the conductive pattern including at least two conductive lines adjacent one another;

a dielectric liner deposited over the insulating layer and the conductive pattern;

an adhesion promoter layer deposited over the dielectric liner, the adhesion promoter layer is a silane coupling agent comprising at least one of: aminopropyltriethoxysilane glycidoxypropyltrimethoxysilane, methacryloxypropyltrimethoxysilane, vinyltrichlorosilane vinyltriethoxysilane and aminopropyltrimethoxysilane; and a low dielectric constant (LDC) material dispersed between the at least two conductive lines and over the dielectric liner, the LDC material including:
  a polymeric material comprising a polymer having a first and second end; wherein the first end includes a functional group adapted to substantially bond to the dielectric liner.

5. The semiconductor device of claim 4, the functional group is a —CO$_2$H functional group containing layer further modified by the addition of either of: a fluorinated polymer and polyacrylic acid.

6. The semiconductor device of claim 4, the second end including a functional group adapted to substantially bond to a dielectric layer deposited over the LDC material.

7. The semiconductor device of claim 4, the polymeric material including air pockets therein.

8. The semiconductor device of claim 4, the plurality of polymers comprising a hydrocarbon chain.

9. The semiconductor device of claim 4, the functional group is a of the first end comprising at least one of: —NH$_2$, —RNH, —R$_2$N, —SiCl$_3$, —Si(OH)$_3$, —CO$_2$H and —OH.

10. The semiconductor device of claim 4, the functional group of the second end comprising at least one of: —NH$_2$, —RNH, —R$_2$N, —SiCl$_3$, —Si(OH)$_3$, —CO$_2$H and —OH.

11. The semiconductor device of claim 4, the LCD material comprising either of: fluorinated poly(arylenether), polyimide, polyolefin and poly(alkyleneoxide).

12. A semiconductor device comprising:

a substrate;

a conductive pattern formed on an insulating layer covering at least a portion of the substrate, the conductive pattern including at least two conductive lines adjacent one another;

a dielectric liner deposited over the insulating layer and the conductive pattern;

an adhesion promoter layer deposited over the dielectric liner, the adhesion promoter layer containing a dendrimer having functional end groups, the functional end groups comprising at least one of: —SiCl$_3$, —NH$_2$, —Si(OH)$_3$ and —CO$_2$H; and a low dielectric constant (LDC) material dispersed between the at least two conductive lines and over the dielectric liner, the LDC material including:
  a polymeric material comprising a polymer having a first and second end; wherein the first end includes a functional group adapted to substantially bond to the dielectric liner.

13. A semiconductor device comprising:

a substrate;

a conductive pattern formed on an insulating layer covering at least a portion of the substrate, the conductive pattern including at least two conductive lines adjacent one another;

a dielectric liner deposited over the insulating layer and the conductive pattern;

an adhesion promoter layer deposited over the dielectric liner, the adhesion promoter layer comprising a reactive surface constituted by a monolayer containing functional groups, the functional groups including at least one of: —CO$_2$H and —NH$_2$; and a low dielectric constant (LDC) material dispersed between the at least two conductive lines and over the dielectric liner, the LDC material including:
  a polymeric material comprising a polymer having a first and second end; wherein the first end includes a functional group adapted to substantially bond to the dielectric liner.

* * * * *